US005542067A

United States Patent [19]
Chappell et al.

[11] Patent Number: 5,542,067
[45] Date of Patent: Jul. 30, 1996

[54] VIRTUAL MULTI-PORT RAM EMPLOYING MULTIPLE ACCESSES DURING SINGLE MACHINE CYCLE

[75] Inventors: Barbara A. Chappell; Terry I. Chappell, both of Amawalk; Mahmut K. Ebcioglu, Somers; Stanley E. Schuster, Granite Springs, all of N.Y.

[73] Assignee: International Business Machines Corporation, Armonk, N.Y.

[21] Appl. No.: 345,328

[22] Filed: Nov. 21, 1994

Related U.S. Application Data

[60] Continuation of Ser. No. 942,409, Sep. 9, 1992, abandoned, which is a division of Ser. No. 873,672, Apr. 23, 1992, Pat. No. 5,204,841.

[51] Int. Cl.$^6$ .................................................. G05F 12/00
[52] U.S. Cl. ........................ 395/494; 365/203; 365/233; 364/DIG. 1; 364/244.8; 395/431
[58] Field of Search .................................. 395/401, 431, 395/476, 494, 495, 496

[56] References Cited

U.S. PATENT DOCUMENTS 4,845,677  7/1989  Chappell et al. ........................ 365/203

OTHER PUBLICATIONS

"Special Application Memories"; 8172 IEEE International Solid–State Circuits Conference; 28 (1985) Feb.; 32nd Conf; by Frank E. Barber, Daniel J. Eisenberg, Gloria A. Ingram, Mark S. Strauss and Thomas R. Wik; pp. 44–46.

"Pipelined Clocked Static Memory"; IBM Technical Disclosure Bulletin; vol. 32; No. 38, Aug. 1989, pp. 431–432.

"Pipelined, Time–Sharing Access Technique for a High Integrated Multi–Port Memory"; IEEE Symposium on VLSI Circuits; 1990; by Tsuneo Matsumura, Ken–ichi Endo and Junzo Yamada; pp. 107–108.

Primary Examiner—Matthew M. Kim
Attorney, Agent, or Firm—Whitham, Curtis, Whitham & McGinn; David Aker, Esq.

[57] ABSTRACT

A virtual multi-port RAM (VMPRAM) structure has automatic port sequencing and single-port array density and speed. VMPRAM employs input-triggered, self-resetting macros in a pipelined architecture to provide multiple self-timed on-chip cycles during one machine cycle. The VMPRAM incorporates an SRAM segmented into many input triggered, self-resetting, fast cycling blocks. A timing signal is derived from a selected SRAM block for releasing the next select signals and data to the SRAM blocks. The SRAM block inputs are only the data input bus and the decoded signals needed to select a wordline and a bitline pair, and the SRAM block cycle is only the time needed to provide adequate pulse width for word lines and bitlines. Each SRAM block, and all the circuit blocks in the path to access the SRAM blocks, are input-triggered and self-resetting. The multiple address and data input latches are multiplexed at the driver to the true and complement buses to the SRAM segments, and those buses are self-resetting. Similarly, the selected SRAM block reads data out onto a self-resetting bus, and address and data inputs are latched in blocks that are set up for the release signal by the release of the adjacent block, and these blocks are all self-resetting.

9 Claims, 7 Drawing Sheets

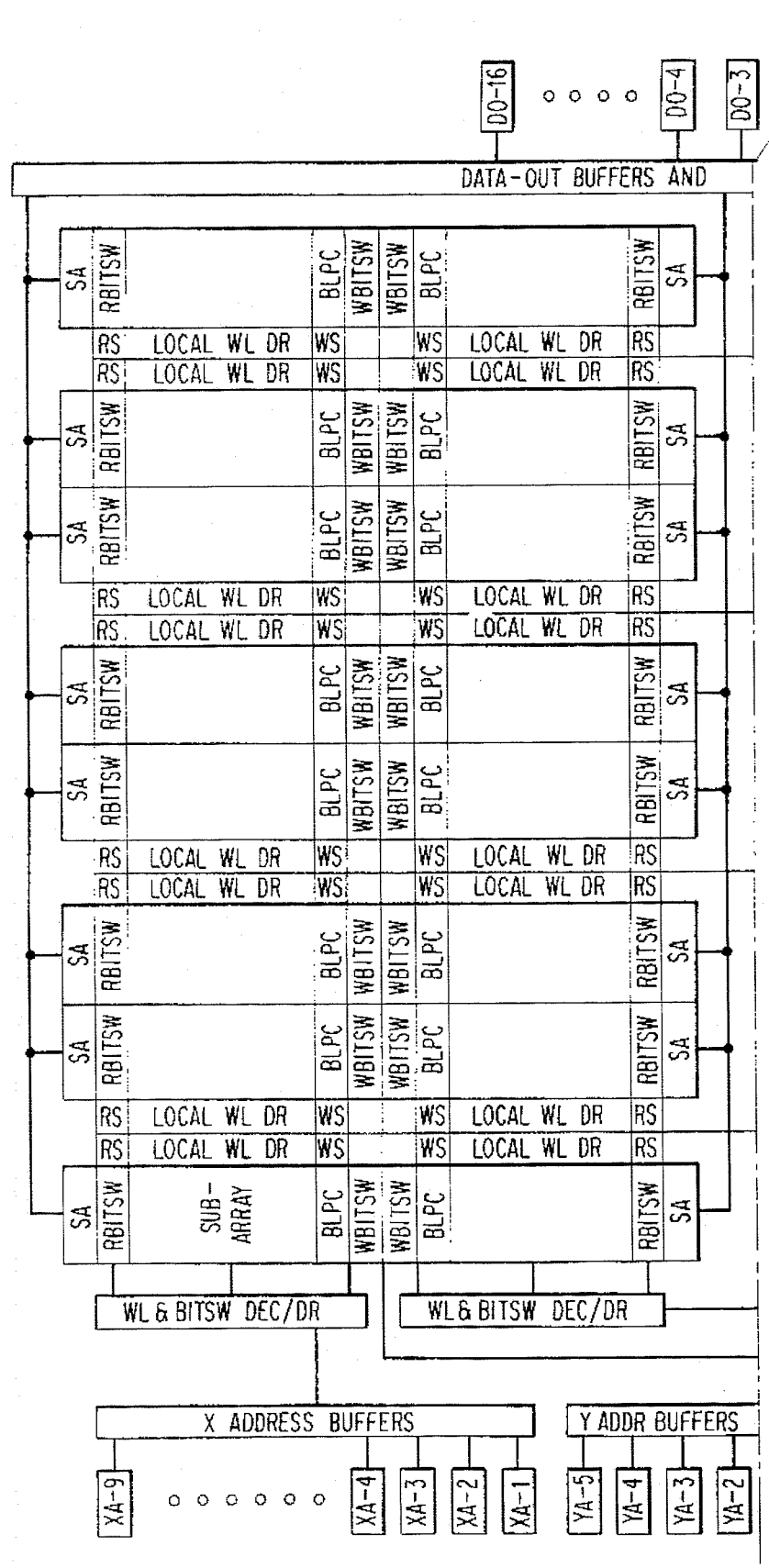

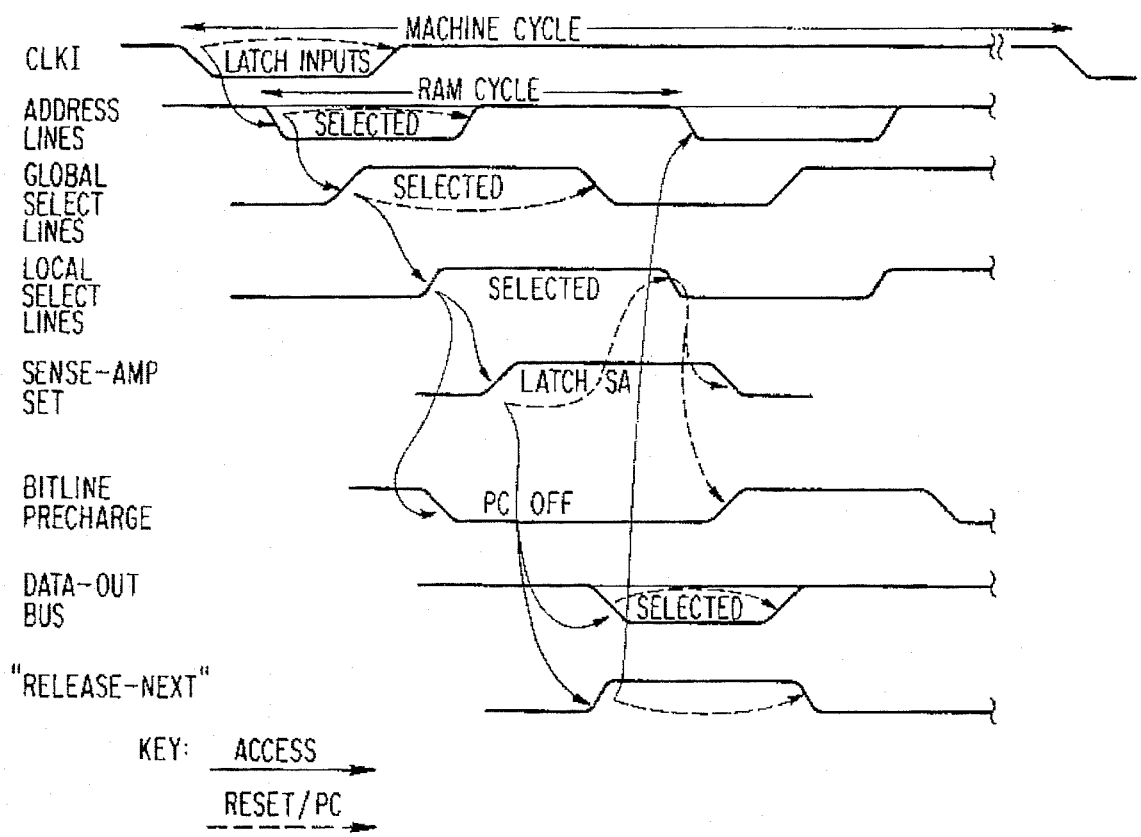

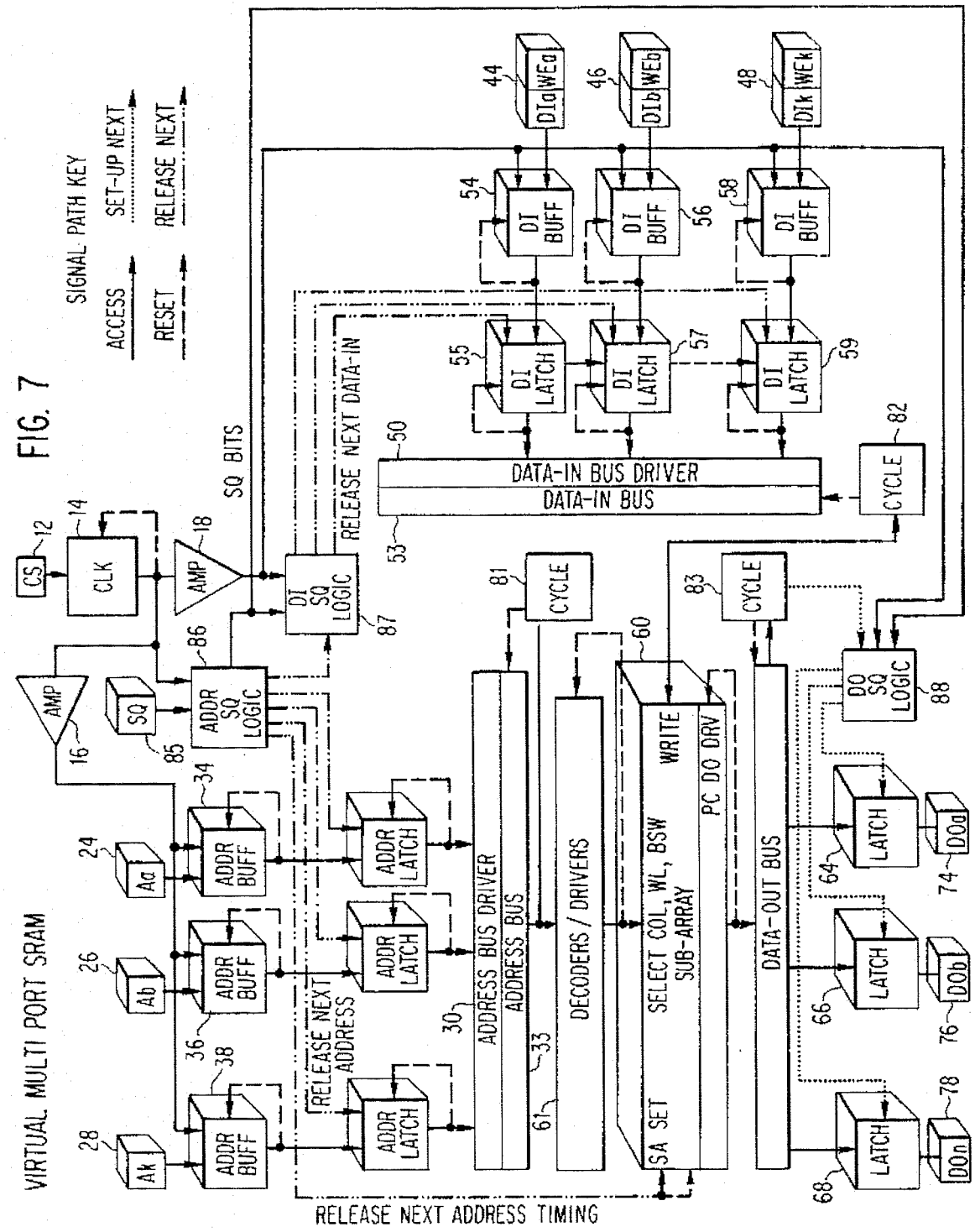

VIRTUAL MULTI-PORT RAM EMPLOYING MULTIPLE ACCESSES DURING SINGLE MACHINE CYCLE

This is a continuation of U.S. patent application Ser. No. 07/942,409 filed Sep. 9, 1992, now abandoned, which was a divisional of U.S. patent application Ser. No. 07/873,672 filed Apr. 23, 1992, now U.S. Pat. No. 5,204,841.

BACKGROUND OF THE INVENTION

1. Field of the Invention

The present invention generally relates to semiconductor random access memory (RAM) devices and, more particularly, to a virtual multi-port RAM (VMPRAM) which combines multi-port RAM function with automatic port sequencing and single-port array density and speed.

2. Description of the Prior Art

Multi-port RAMs have been developed for high speed applications, such as real time signal processing or parallel data processing. In the former application, multi-port RAMs may be used as main memory to handle large amounts of data simultaneously. In the latter application, multi-port RAMs may be used as shared cache memory for a plurality of processors.

For example, U.S. Pat. No. 4,783,732 to Morton describes a multi-port memory including first and second memory lines. Each signal line can simultaneously and independently access a particular address during a read memory portion of a clock pulse whereas both signal lines are used to write data to one address during another portion of the clock pulse.

U.S. Pat. No. 4,766,535 to Auerbach et al. describes a multiple port memory responsive to addresses within an instruction cycle for supplying data read from the read addresses and for writing data received at the write addresses. The memory apparatus comprises groups of memory banks, responsive to the read addresses and the write addresses, for supplying for each of the read addresses data read from one of the banks in one of the groups and for writing data received at each of the write addresses in the other of the banks in the groups. A pointer for controlling the groups of memory banks directs the read and write accesses to the memory banks so that one of the banks obtaining valid data is read in response to a read address and so that data is written to the other banks in each cycle.

U.S. Pat. No. 4,740,894 to Lyon describes a processing element used either separately or in an array of similar processing elements for performing concurrent data processing calculations. The processing element includes a multi-ported memory unit for storing data to be processed by any of a plurality of function units which are connected to the multi-ported memory unit. The multi-ported memory unit includes a number of data storage slots for storing data words to be processed and the results of the processing. Each function unit performs a calculation having as its inputs one or more data words from the multi-ported memory unit. The result of this calculation is stored back in the multi-ported memory unit. The transfer of data to and from the function units is accomplished by use of the ports on the multi-ported memory unit.

T. Matsumura et al. in their paper entitled "Pipelined, Time-Sharing Access Technique for a Highly Integrated Multi-Port Memory", submitted to the 1990 VLSI Symposium, describe one attempt to provide a multi-port function using a consecutive time-sharing access technique. In their conceptual model, a four-port memory function is realized using a two-port memory cell array within one cycle. In the first half of the cycle, two-port memory cells are accessed simultaneously by addresses $A_0$ and $A_2$. The data $D_0$ and $D_2$ are written to the selected two-port memory cells or read out from them in parallel. In the second half of the cycle, the other two-port memory cells are selected concurrently by the addresses $A_1$ and $A_3$, and the data $D_1$ and $D_3$ are written to or read out in the same manner as before.

While the Matsumura et al. approach offers certain advantages, the two accesses executed to the memory during one cycle are timed externally and the access path is pipelined only relative to input and output latches. This limits the speed of the memory. In addition, the large, two-port memory cell used is a low density device which further limits the speed of the memory as well as its capacity. Moreover, any system using a memory employing the Matsumura et al. technique will have to resolve contention off the chip.

Multi-port access to a large, high speed data memory cache is the key to advanced parallel machine architectures. European Patent Application 0136218 published Apr. 3, 1985, discloses a horizontal computation device including a multi-port RAM in combination with independent pipelined memoryless junction modules. The device is operative to implement a class of algorithms involving a high ratio of arithmetic computation to control complexity and good locality of data reference. The memory structure is a parallel input, parallel output random access memory having a plurality of dedicated serial buffered input ports and dedicated serial buffered output ports. The buffered ports are operative to provide transient storage in independent pipelines and parallel input and output to addressed locations of the random access memory.

What is needed is an efficient multi-port function implemented in a high-speed, high-density RAM structure that approaches the speed and density of current single port RAM structures. A multi-port RAM of this type can be exploited in the design of many types of computers.

SUMMARY OF THE INVENTION

It is therefore an object of the present invention to provide a multi-port RAM structure which combines a multi-port function with the speed and density that cannot be matched with either conventional multi-port RAMs or multiple data copies in conventional single-port RAMs.

It is another object of the invention to provide a high-speed, high-density multi-port RAM wherein the order in which read and write operations are preformed is well defined, thus avoiding contention, and can be made programmable.

According to the invention, a virtual multi-port RAM (VMPRAM) is provided which employs input triggered, self-resetting macros in a pipelined architecture to provide multiple, self-timed on chip cycles during one machine cycle. The VMPRAM is implemented with the same array density and speed as a single-port RAM. The virtual multi-port RAM structure is implemented in a preferred embodiment as a pipelined semiconductor memory chip segmented into a plurality of sub-arrays. Each of the sub-arrays includes circuitry providing local self-timed reset and precharge functions independent of other sub-arrays. The chip includes a plurality of address latches, a plurality of data-in latches; and a plurality of data-out latches, each of the latches being sequentially interconnected to provide a set-up next cycle signal for enabling a succeeding latch. Additional circuitry derives from a selected sub-array a release next cycle signal to said each of the plurality of address latches and the plurality of data-in latches to release next select signals and data to the sub-arrays thereby providing automatic port sequencing. Also described is an architectural modification which provides for the port sequencing to be programmable while retaining the distinguishing VMPRAM feature of internal cycling derived from the self-timed cycling of the arrays.

The VMPRAM is especially important for practical realization of a recently proposed parallel computer architecture which achieves high performance with a very long instruction word (VLIW) and the use of parallel central processing units (CPUs) operating on the same instruction and/or data stream. A description of a particular version this architecture is provided by K. Ebcioglu in "Some Design Ideas for a VLIW Architecture for Sequential-Natured Software" published in *Parallell Processing*, M. Cosnard et al., editors, pp. 3–21, North Holland, 1988. The VMPRAM according to the invention provides write and read from the multiple CPUs within one cycle with automatic sequential port priority and with single-port array density. This density allows a very large data cache to be packaged with the CPUs in a single module. The VMPRAM port-priority features not only eliminate any wait-state overhead for resolving contention but also allow a greater degree of freedom in ordering instructions during compilation.

By contrast, conventional multi-port RAM cells have a density too low to allow packaging a large enough data cache together with the CPUs in one module. Moreover, the priority of operations to the same address from different ports is difficult to enforce. The alternative of multi-port emulation with conventional single-port RAMs has even worse contention problems, since wait-states will be required for simultaneous calls for writes to the same chip. It also is very costly, requiring storage of multiple copies of the data and a large cross-point switch as well as other control overhead. Neither approach can provide the multi-port function to a parallel machine, such as VLIW, with enough density and speed for a practical implementation.

BRIEF DESCRIPTION OF THE DRAWINGS

The foregoing and other objects, aspects and advantages will be better understood from the following detailed description of a preferred embodiment of the invention with reference to the drawings, in which:

FIGS. 2, 2A and 2B, taken together, are a schematic illustration of a 256K semiconductor memory chip partitioned into a plurality of sub-arrays;

FIG. 6 is a timing diagram showing the sub-array timing of the preferred embodiment shown in FIG. 5; and FIG. 7 is a block diagram showing the architecture of the virtual multi-port RAM with programmable sequencing ports.

DETAILED DESCRIPTION OF A PREFERRED EMBODIMENT OF THE INVENTION

Figure 1:
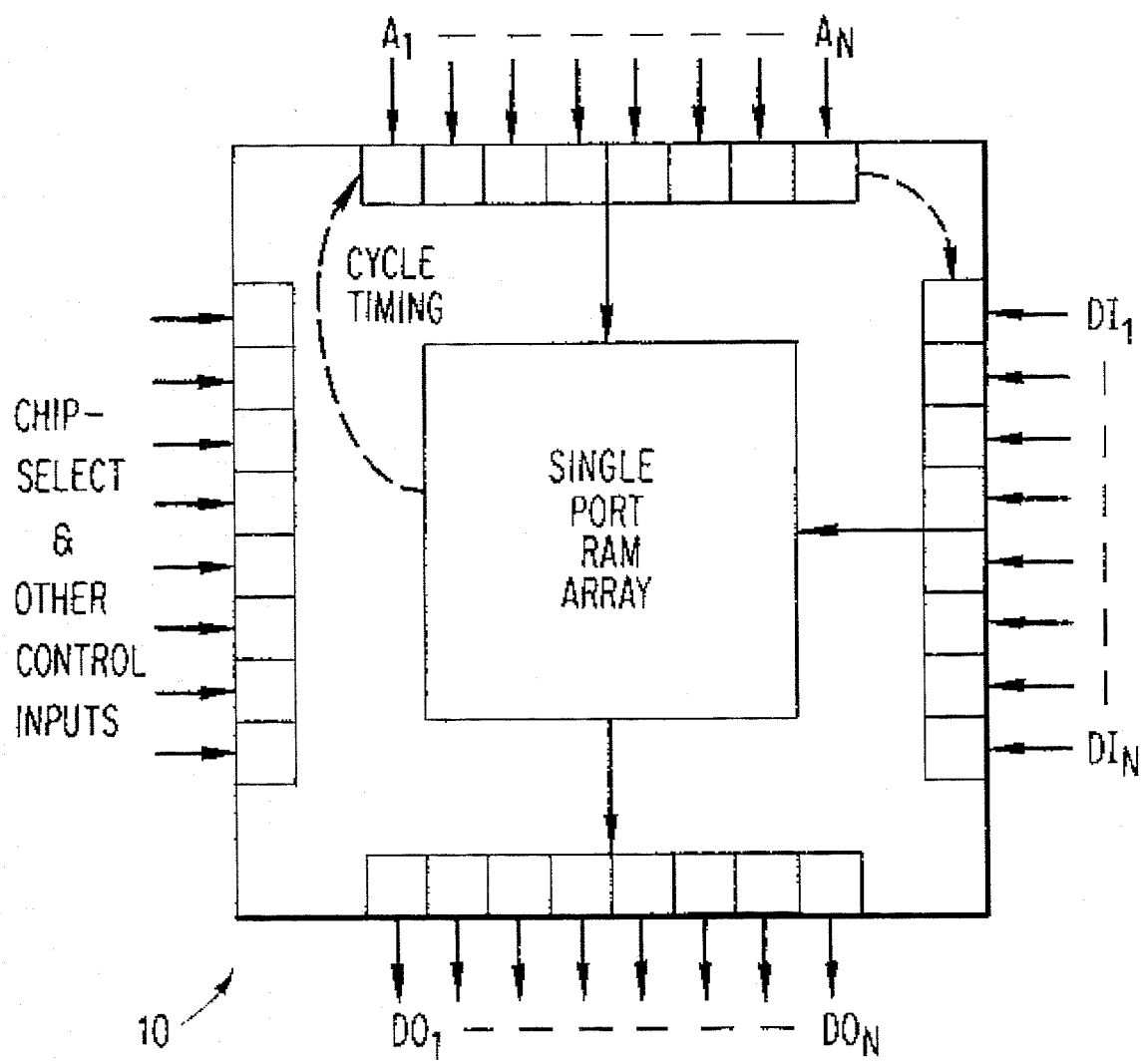
FIG. 1 is a high level block diagram of the virtual multi-port RAM according to the invention.

Referring now to the drawings, and more particularly to FIG. 1, there is shown the high level block diagram of the virtual multi-port RAM (VMPRAM) 10 according to the invention. The virtual multi-port RAM function is basically identical to that of a conventional multi-port RAM, but with built-in contention resolution. The addresses $A_1$ to $A_N$, data input $DI_1$ to $DI_N$, and control signals become valid simultaneously at the port inputs, at the beginning of the machine cycle. At the conclusion of the machine cycle, the access data is valid on the output ports $DO_1$ to $DO_N$, and the input data has been written into the RAM array. Unlike a conventional multi-port RAM, the VMPRAM internally contains arrays of conventional single-port RAM cells, which are cycled multiple times during a single machine cycle to service the multiple cycles. The timing for the internal multiple cycling is derived from the self-timed signals within the arrays. The internal wiring (the address and data buses) between the I/O port storage elements and the arrays is shared by the multiple ports and is cycled in synchronism with the array cycling. Thus, the arrays and the wiring and peripheral circuitry supporting the array has a density equivalent to a fast cycling, single-port RAM.

Both the internal cycle and the read access are fast due to the use of pipelining, self-timing, and array segmentation. As will become evident with further description, in the VMPRAM 10, a pipeline latency exists for a read operation but not for a write operation. Therefore, there may be more write-only ports than read/write ports. Since the port sequencing, and data bus timing, is automatically timed from on-chip circuitry, the priority between read and write operations and between different address ports is well defined.

To provide many internally-timed chip cycles during one machine cycle, the VMPRAM according to the invention employs input-triggered, self-resetting macros in a pipelined architecture and an array of standard RAM cells (preferably complementary metal oxide semiconductor (CMOS) six device cells). An example of the pipelined architecture as disclosed in U.S. Pat. No. 4,845,677 is described below with reference to FIGS. 2A, 2B and 3.

Figure 2B:
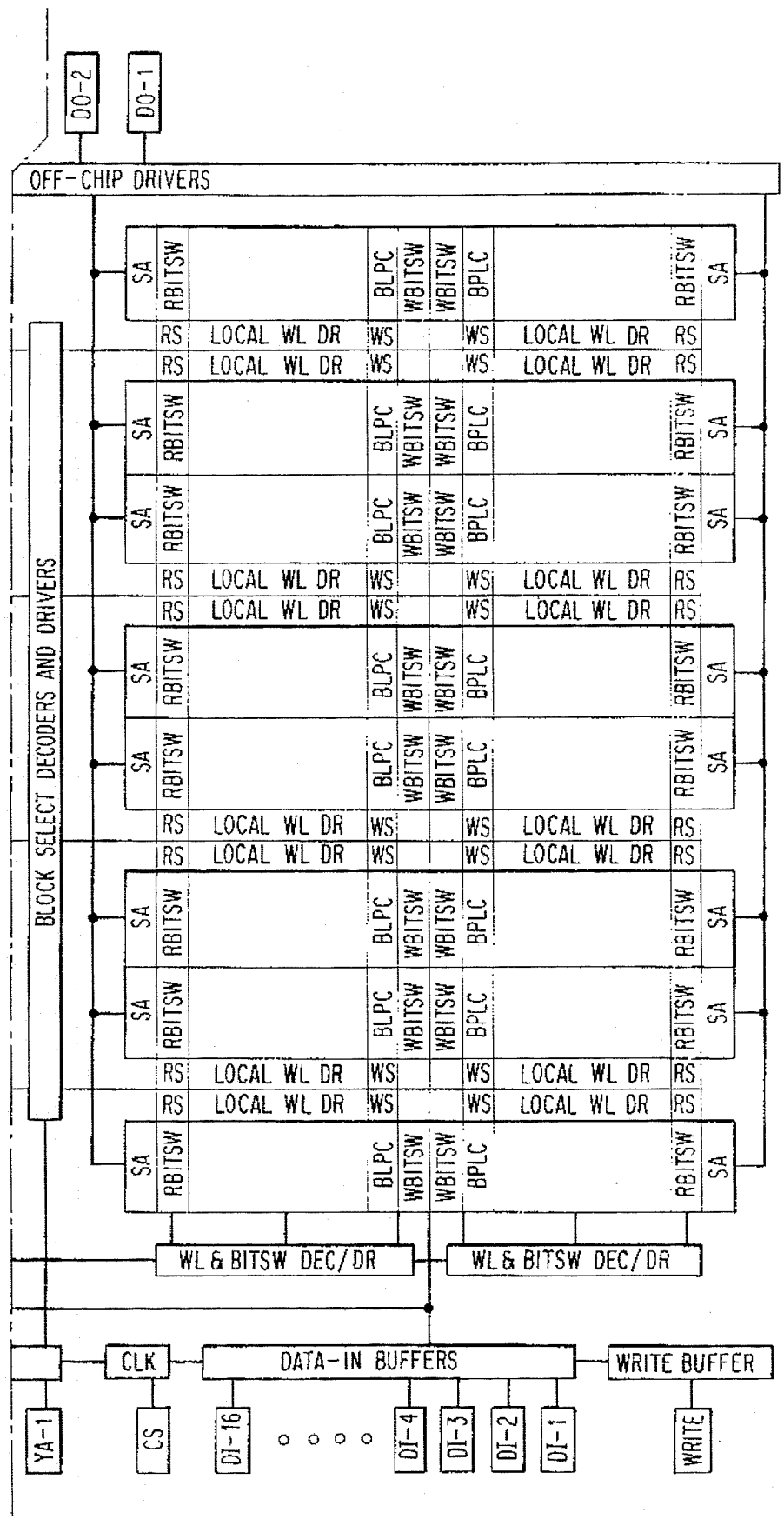
Figure 3:
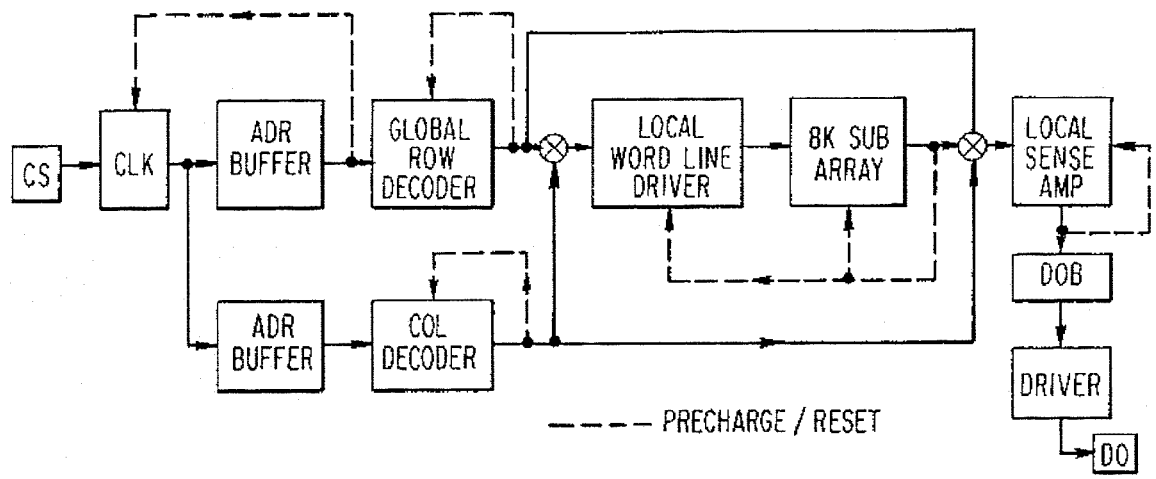
FIG. 3 is a schematic illustration of a simplified depiction of a semiconductor memory chip including both a local precharge/reset technique and block address circuitry.

With reference to FIGS. 2A, 2B and 3, there is shown a schematic illustration, referred to in the art as a floor plan, of a 256K bit CMOS (complementary metal oxide semiconductor) chip that is partitioned into thirty-two 8K bit sub-arrays with local decoding and precharging. The sub arrays are arranged in eight columns and four rows, and each sub-array is organized as 128 word lines by 64 bitline pairs with 4-way bitswitches and 16 resistively decoupled, self-timed sense amplifiers which are located onboard, next to the sub-array. The structure uses standard CMOS memory cells composed of six devices. The abbreviations used in FIGS. 2A and 2B refer to the following elements:

| | |
|---|---|
| CS | Chip Select Input |
| SA | Sense Amplifier |
| BITSW | Bitswitch |
| RBITSW | Read Bitswitch |
| WBITSW | Write Bitswitch |
| RS | Local Read Bitswitch Decoder/Driver |

| | |
|---|---|
| WS | Local Write Bitswitch Decoder/Driver |
| WL | Word Line |
| BL | Bitline |
| WLDR | Word Line Driver |
| BLPC | Bitline Precharge |
| DEC | Decoder |
| DR | Driver |
| ADDR AMPS | Address Amplifiers |
| DI | Data In |
| DO | Data Out |
| XA | X-Address Input |
| YA | Y-Address Input |

As shown in FIGS. 2A and 2B, each sub-array includes a separate read bitswitch, write bitswitch, bitline precharge circuit, local word line driver and sense amplifier. Local word line and local read and write bitswitch decoder/drivers are associated with each of the thirty-two sub arrays. X address amplifiers and Y address amplifiers are coupled to the word line and bitswitch decoder/drivers and block select decoder/drivers, respectively, under control of a clock signal generated from the Chip Select Not Input. Data-in amplifiers provide inputs to each of the thirty-two sub-arrays under control of the clock signal and the write input. The sense amplifiers associated with each of the thirty-two sub-arrays are connected to data output lines via data-out latches and off-chip drivers.

The sub-array arrangement illustrated in FIGS. 2A and 2B includes local decoding and precharging and, therefore, is operable in a pipelined manner with more than one access being capable of propagating through the chip at any given time. Chip access time is the time it takes, beginning with a given chip to be selected, for the selected chip information to appear at the chip output. The chip cycle time is the selection repetition rate which indicates when, or how frequently a chip can be selected. The pipelined architecture of FIGS. 2A and 2B permits a chip cycle time that is less than the access time.

To achieve a cycle time less than the access time, a localized precharge is performed as illustrated in FIG. 3. The memory chip consists of a number of blocks or macros. During an access, data simply ripples from block to block, each block activating a succeeding one. In FIG. 3, the solid lines represent data access paths, while the dashed lines represent precharge/reset paths.

The sub-arrays can be considered as an array of chips with only one of them being activated each selection. The sub-arrays with their own localized word line drivers, bitswitches, self-timed sense amplifiers and precharge circuits are virtually independent chips. Additionally, each of the global blocks, external to the sub-array local circuitry, has self-timed precharge and reset circuitry. In other words, each block in the critical path shown in FIG. 3 is switched into the active state by the previous block's input signal but is returned to its precharge/standby state by self-contained circuitry.

Being able to precharge a block very quickly after it has performed its function in anticipation of the next access is a key feature of this architecture. The minimum time before another access can be started is the active time plus the precharge time for the slowest block in the access path. Other features of the pipelined memory chip structure disclosed in U.S. Pat. No. 4,845,677 as it applies to the present invention are described hereinafter. For further details, the reader is referred to the patent.

Using the above-described pipeline techniques, the on-chip RAM cycle time can be many times faster than the machine cycle. Typically, a machine cycle includes two or more chip crossings as well as many more on-chip stage delays than required to access data on a RAM chip. Moreover, the RAM is pipelined internally, so that the cycle time of the chip (i.e., the potential data rate) is substantially shorter than the time needed to access the first data. Because the data path in a RAM is so well defined, more extensive pipe-segmentation is possible than with the logic circuitry in the CPU. In the VLIW application, for example, the internal cycle for a static RAM (SRAM) has been sized to be less than ⅛ the machine cycle time, utilizing the same technology to implement both the CPU and cache chips. Since the VMPRAM is implemented with conventional SRAM cells, it can be realized in a chip area only slightly larger than would be needed for a single port RAM.

The key features of the VMPRAM are the use of the pipelined RAM architecture, illustrated in FIGS. 2A, 2B and 3 and described in more detail in U.S. Pat. No. 4,845,677, combined with self-timed multi-cycling to service multiple input/output (I/O) ports. The VMPRAM function is illustrated in more detail by the waveform diagram of FIG. 4. At the top of the figure, the chip inputs for one machine cycle are shown. These include the chip select, data-in and address inputs in the middle of the figure, the on-chip signals are shown. The first of these is the address bus signals, illustrating the chip cycle. The second is the sub-array set signals, and the third, the data-out bus signals. At the bottom of the figure, the off-chip driver signals are shown, including the data-out signals $DO_1$ to $DO_N$.

Figure 4:
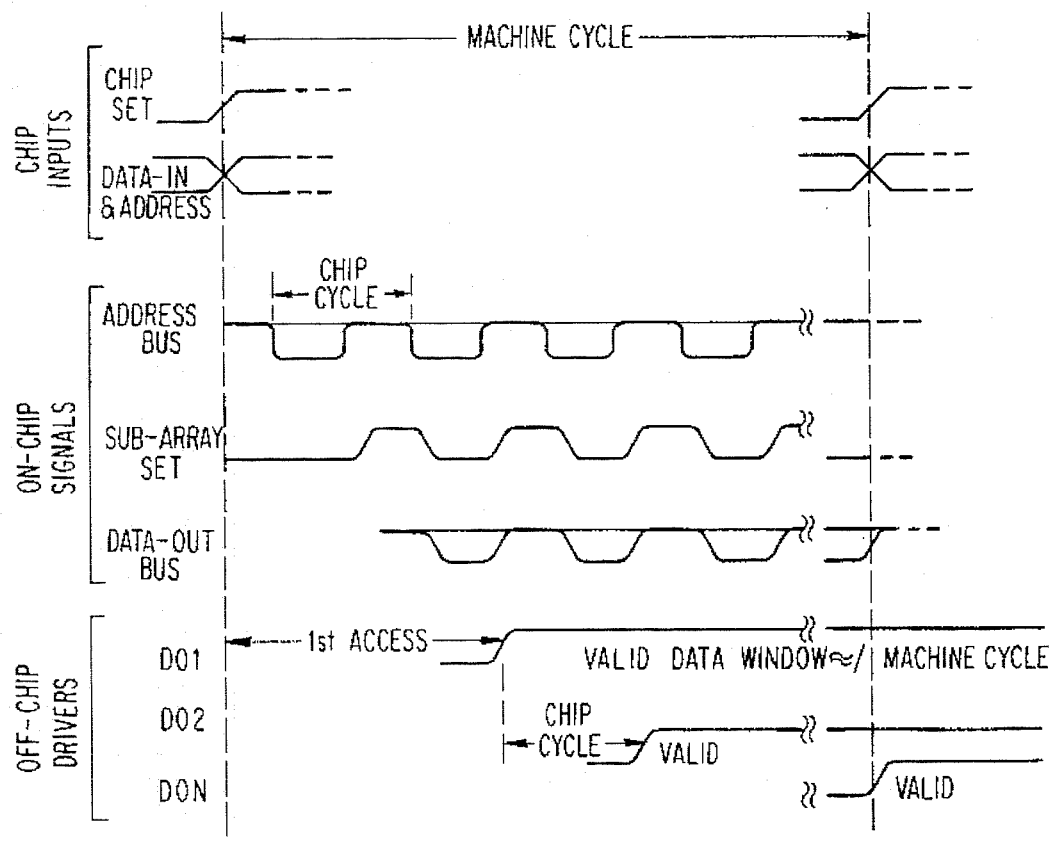
FIG. 4 is a timing diagram illustrating the multi-port, multi-cycling of the inputs and outputs to the virtual multi-port RAM relative to a few key signals internal to the virtual multi-port RAM according to the invention.

The illustration in FIG. 4 assumes that the time to access the first data is twice the internal chip cycle time, which is ⅛ the machine cycle time. It also assumes that all inputs are valid when the chip-select input signal rises and that all data must be valid when chip-select signal rises at the next machine cycle boundary. In this case, the latency for access to the first data results in a potential read to seven data locations, assuming the last read cannot overlap with the next machine cycle. However, since all overlap for a write is on-chip, eight write operations could be serviced in one machine cycle, or seven reads followed by one write. In other words, any combination of read or write operations can be done on the first seven ports, but the eighth port is write-only. In addition, some of the read ports may be lost if the machine requires the data out to be valid some time (D) before the end of the machine cycle for data transmission.

In FIG. 4, D is equal to 0 because it is assumed that there is overlapping transmission with the next cycle. Put more generally, if K is the ratio of machine/on-chip cycle times, L is the ratio of on-chip access/cycle times, and D is the number of chip cycles of delay needed before the end of the machine cycle for data transmission, then there can be N ports usable for both read and write, where $$N=K-(L-1)-D. \tag{1}$$

In addition, there may be K–N write-only ports. In all cases, N and K are rounded down to the nearest integer.

As is evident from the timing description, internal pipelining of the RAM for a fast cycle time without degradation of the first access is important to emulating a wide multi-port function. A method for pipelining the RAM has been described in the aforementioned U.S. Pat. No. 4,835,677. It employs input-triggered, self-resetting timing of each macro. An example of the localized precharge is described in the publication by B. A. Chappell et al. entitled "Self-Timed Pulsed Wordline", *IBM Technical Disclosure Bulle-* tin, Vol. 30, No. Dec. 7, 1987. According to this method, the array is heavily segmented into sub-arrays, each of which is also input-triggered and self-resetting. In other words, the leading edges of the pulses which select a sub-array or any other macro cause it to transition to its active state, after which precharge is initiated by signals internal to the sub-array or macro. All macro input circuits, to a first order, are insensitive to the back-edge of the selection pulses. Since the sub-array is the largest indivisible macro, the other macros external to the array can be made with few enough stages that the cycle time in each is less than that needed for cycling the sub-array. In a well balanced, high speed SRAM design, the cycle time of the sub-array, and therefore of the chip, is equal to about ½ the total read access time.

A key feature of the VMPRAM is that the cycle and access times of single-port pipelined RAM described in U.S. Pat. No. 4,845,677 is not significantly degraded by the additions needed for the multi-port function. The path for the first access is essentially unchanged, with only modest additional loading required to latch the inputs on the additional ports and to set up for automatic generation of the next cycle. The timing for the release of the next access is generated by tapping out of the sub-arrays onto a common line going to the address latch circuits. All address and data inputs and data outputs have the same type of latch circuit. During the first on-chip cycle, all input latch circuits are set to store the state of the inputs until signaled to release that state for the appropriate cycle. Outputs of the input latch circuits are dotted at the drivers for the address and data-in buses. The enable for release of the next cycle comes from the transition of the adjacent latch to the active drive state for the current cycle. The data-out buffers also include a latch that stores the previously read state until written by the next appropriate chip cycle.

Figure 5:
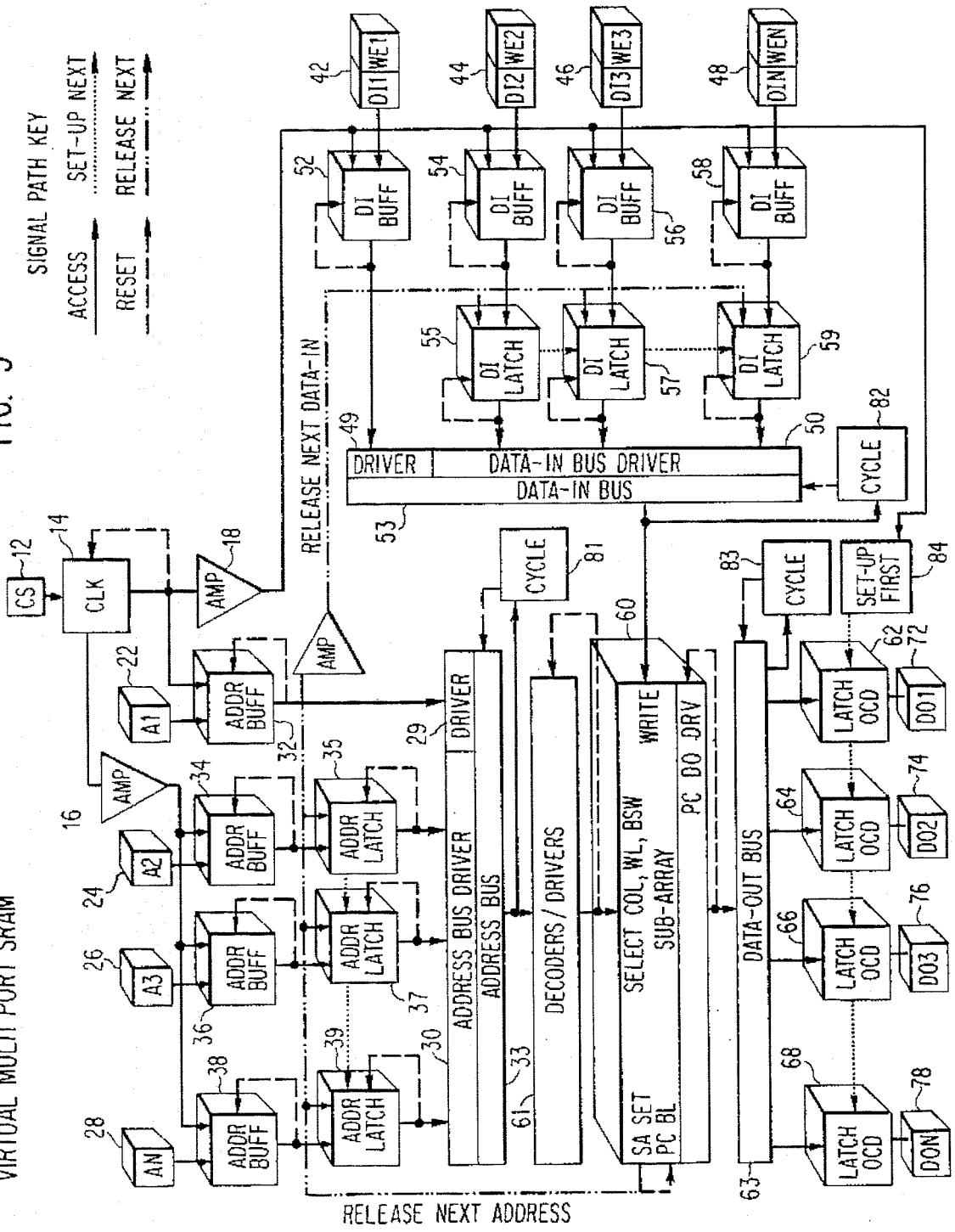
FIG. 5 is block diagram showing in detail the architecture of a preferred embodiment of the virtual multi-port RAM according to the invention and also illustrates the key timing paths for self-timed cycling of the sub-arrays and buses of the virtual multi-port RAM.

A specific VMPRAM architecture according to a preferred embodiment of the invention is shown in the block diagram of FIG. 5. This version of the VMPRAM has particular application in the VLIW machine mentioned above, as well as other machine applications. As shown in FIG. 5, the chip-select (CS) signal is applied to a CS input terminal 12 connected to an on-chip clock (CLK) 14. Clock outputs are supplied to clock driver amplifiers 16 and 18 which respectively supply the clock signals for the address and data input signals. The address signals are applied to a plurality of address terminals 22, 24, 26, and 28, here designated as $A_1$ to $A_N$ and connected to corresponding address buffers 32, 34, 36, and 38. Similarly, the data-in signals are applied to a plurality of data-in terminals 42, 44, 46, and 48, here designated as $DI_1$ to $DI_N$ and connected to corresponding data-in buffers 52, 54, 56, and 58. Address buffers 32 are directly connected to address bus drivers 29 of address bus 33, whereas address buffers 34, 36 and 38 are multiplexed into address bus drivers 30 via address latches 35, 37 and 39, respectively. Similarly, data-in buffers 52 are directly connected to data-in bus drivers 49 of data-in bus 53, whereas data-in buffers 54, 56 and 58 are multiplexed into data-in bus drivers 50 via data-in latches 55, 57 and 59, respectively.

The address bus 33 and the data-in bus 53 provide the inputs to sub-array 60. More specifically, the address bus provides an output to the decoders/drivers 61 which, in turn, supplies the select signals to the sub-array. The data-in bus 53 supplies data to the write input of the sub array. The output of the sub-array is supplied to the data-out bus 63 and thence to a plurality of off-chip drivers (OCDs) 62, 64, 66, and 68. The OCDs are, in turn, connected to the data-out terminals 72, 74, 76, and 78, respectively, here designated as terminals $DO_1$ to $DO_N$.

In the block diagram of the preferred embodiment of the VMPRAM shown in FIG. 5, the depth of the boxes is meant to indicate that there are copies of this circuit that are identically interconnected. For example, there is one clock 14, but a set of address buffers 32, 34, 36, and 38 for each address port $A_1$ through $A_N$, followed by latches 35, 37 and 39 for each address bit, which in turn all dot onto one of two address-bus-drivers for the address bus 33. Arrows indicate signal connections, with four types of signal paths shown. Solid lines, such as from the latches to the busses, are access paths for selecting cells for a read or write operation and for routing the stored state to the data-out port. Dashed lines, such as from the outputs of the latches back to the latches are reset paths for returning the macros to the initial state for standby until the next access. The reset paths control the pulse-width of the macro outputs. The outputs of each of the buses 33, 53 and 63 are respectively supplied to cycle circuits 81, 82 and 83 which provide a reset to each of the buses. The dotted lines, such as those extending from latch to latch, are set-up-next-cycle paths for enabling the macro to respond to the next release input. Finally, the dashed-dotted lines, such as that extending from the sub-array 60 back to the latches 35, 37 and 39, are release next-cycle path for triggering the drive of the stored macro state to the next macro.

The first two signal types (i.e., the access and reset signals) are needed for a single-port pipelined RAM, while the latter two (i.e., the set-up next and release next signals) are for the multi-cycling, multi-port function. All on-chip signals, prior to the off-chip driver (OCD) and associated latch, are fully pulsed each chip cycle. All macro inputs are designed to be responsive to only the leading edge of the input signals from any of the four paths.

An access is initiated by the rise in the CS input (chip select or system clock) applied to terminal 12 being detected and amplified for on-chip drive by the CLK macro. The CLK output then is used to set the address buffers for the A1 port 22. The address buffer 32, like all the other chip-input buffers, detects the input state and converts it to true and complement on-chip levels in response to the leading edge of its CLK input. The buffers for the first address port A1 have dedicated address bus drivers 29. The other buffer outputs multiplex into a second address driver 30.

Besides triggering the first access, the on-chip clock (generated from the CS input edge) is amplified for adequate drive to also trigger the buffering and subsequent latching of all the other address inputs, the data inputs, and any other input ports (such as write-enable). In addition, this clock pulse is buffered in "set-up first" circuit 84 to signal the set-up of the data-out driver circuitry for the first port to latch and drive off-chip the state signaled by the appropriate data-out bus pulse, as will be further described. Since this buffering of the clock can be done in parallel with the first on-chip cycle, enough delay can be used for the amplification of the on-chip clock so that the loading added to this critical signal can be kept very small.

The state of the address buffers and the data-in buffers for ports $A_2$ to $A_N$ and $DI_2$ to $DI_N$ are stored in the latch macros, but the output of each latch macro stays non-conductive until signaled first by its "set-up next" input from the adjacent buffer and then by the common "release" input. As is the case for all macros, the transitions of the address latch macro output to the selected state signals its self-contained timing circuitry to reset and precharge the macro with an appropriate built-in delay for an adequate pulse width to trigger the next macro. Similarly, the address bus has a dedicated "cycle" circuit with a precharge driver and hold circuit to ready it for the next cycle or to hold the precharged state in case the chip returns to standby. Of course, there are actually multiple address buses; one each to select the sub-array, the wordline, and the bitline. The bit-width and delay are different for each bus, but the associated circuitry is similar. Each has a driver dedicated to the path for the first cycle and a shared driver for the other address port paths, as well as its own cycle circuit. Only the slowest address bus path (usually the wordline address lines) would be tapped to generate the "release next data-in" signal.

The, dotting onto each address bus of only two drivers and one precharge circuit keeps bus loading to about the same as in a single port version, while the drive for the access path is the same as it would be for a single-port version. Thus, the added multi-port function can be implemented without significant increase in delay relative to the single port: SRAM described in U.S. Pat. No. 4,845,677 or conventional SRAM.

The same extensive array segmentation used in many state-of-the-art single-port RAM designs for high speed access and peak current minimization is used for the same reasons in the VMPRAM. The size of the sub-array is determined by a trade-off between sensing and data-out bus delays. More sub-division of the array results in smaller bitline capacitance but more capacitance on the data-out bus. In the 256K design illustrated in FIGS. 2A and 2B, the 32 sub-arrays are composed of 128 rows by 64 bitline pairs, with 16 sense amplifiers in each sub-array. The 32, 16-bit sub-array outputs dot onto the data-out bus which feeds into the output circuits. This sub-array segmentation results in a delay balancing which makes the access time about equal to twice the cycle time. For the same reasons as in conventional SRAMs, the CMOS six-device storage cell is preferred for the VMPRAM for the best combination of read and write speed and stability. Thus, the sub-array design for the VMPRAM is nearly identical with that for the single-port SRAM and has similar delay and density characteristics.

As has been mentioned previously, the sub-array timing is all self-contained, and this timing chain is tapped to generate the "release next address" signal. The waveforms of FIG. 6 illustrate the self-timed cycling of the sub-array and the buses which wire the sub-arrays together. CLKI is the signal which triggers the setting of the input storage means, latching the input port data and also the driving of the first port information onto the address and data-in buses. The CLKI signal pulses once each machine cycle. The address buses transport the true and complement of the input address state for first port to the word, bit and sub-array select global decoders. Alternatively, the addresses could be partially pre-decoded before being driven to the decoders. For highest speed, the address buses are preferably precharged high and selectively discharged. A self-timed pulse width is provided by a dedicated precharge block for each address line (see FIG. 5). A transition of the address bus from all lines high to selected lines discharged triggers the global decoders. The global decoders provide further decoding and drive the wordline, the bitswitch and the sub-array select signals to all or some of the sub-arrays. These decoder blocks also have dedicated precharge circuitry which reset the Global Select lines to the deselected state (low as shown in FIG. 6, for example) with a pulse width that is insensitive to the pulse width of the address bus, within reasonable bounds.

The transition of the appropriate Global Select Signals at the inputs of the Local Select circuitry contained within each sub-array (FIG. 5) triggers the drive of the Local Select lines which result in the reading, writing and sensing of the cell state. For example, the selected bitline precharge is turned-off, the selected bitswitches turned-on, the selected wordline driven high, and the selected cells begin discharge of the attached bitlines. Timed from these selection signals, or matched "dummy signals", is the setting of the appropriate sense amplifiers to amplify and latch the bitline state. The setting of the sense amplifiers triggers the termination of the local select pulses and the beginning of the bitline precharge for the previously selected sub-array. Similar to the Global Select decoders, the Local Select circuitry is designed to have a self-timed pulse width that is insensitive to the pulse width of the address bus, again within reasonable bounds. Meanwhile, the selected sense amplifier states are driven onto the data-out buses which connect all or some sub-arrays to the data-out latches near the data-out drivers. Like the address buses, the data-out bus lines have dedicated precharge circuitry that determine the bus pulse width.

The same timing used to trigger sense amplifier setting is also amplified to drive the "release-next" signal bus, which is fed back to the blocks storing the address and data-in states for the multiple ports. The transition of the "release-next" signal results in the driving of the address and data-in buses to the selected state, thereby beginning a new internal VMPRAM cycle. Similar to the address and data buses, this signal is common to many or all sub-arrays and has a dedicated precharge circuitry for a self-timed pulse width. To control loading, the "release-next" signal can be buffered by an amplifier for driving to the data-in circuitry. The added delay for this amplification can be adjusted for a particular application for proper synchronization between local array selection and the data-in bus pulse. The cycle timing of the data-out peripheral system is similar to that described for the address and data-in circuitry, except that the pulsing of the data-out bus directly provides the "release-next" timing. In other words, the data-out bus transition triggers the previously "set-up" latch to switch to the corresponding state, which is then amplified as appropriate for off-chip drive. (The VMPRAM is described as a separate chip, but it could also be macro integrated on a chip with logic in the same way as is often done with standard RAM functions.) The data-out circuitry for the first port is enabled by the "set-up-first" logic which had been triggered by the buffered on-chip clock signal. When the first port circuit transitions, it outputs a set-up signal to enable the next latch circuit to respond to the subsequent data-out bus pulse. The same procedure for latch-after-set-up and generate next set-up continues for the $DO_1$ through DON latches. For maximum data-window, the latch holds the state of the previous data until overridden by the next data. Alternatively, for faster operation with a smaller window, a delayed CLK signal could be used to reset all the OCD latches, immediately following chip-select, before the first data appears on the data-out bus. In any case, this data-window/delay trade-off is no worse for the VMPRAM than for the single-port RAM case.

As with the address path and the data-out path, the data-in path is the same as for single-port RAM for the first on-chip cycle, with subsequent cycles set-up and released by the previous one. As with the address path, the data in state is stored in latches and dotted at the data-in bus driver input. The data-in path is driven only when enabled by the write-enable input for each port. As in the single-port case, the sub-array operation is the same for either a read or write operation. Only the discharge of one leg of the true-and-complement data-in bus distinguishes a write from a read. Synchronization of the data-in release with the address release is required. However, the release of the next data-in can be triggered from the address line bus state change instead of loading the release-next-address line. As with the address and data-out buses, the data-in bus has a dedicated cycle circuit which determines its pulse width.

The latches used for storing the input or output states can be implemented with any standard storage means, such as cross-coupled transistors or precharged capacitors, since storage is required for only a limited period of time. In any case, the storage means needs to be equipped with an initialization means to assure the non-set-up state with power-on. The circuitry specified for the preferred embodiment of FIG. 5 consists of flip-flop latches with static load initialization. In addition, the circuitry includes a two phase latch so that the address buffer can cycle independently of the latch circuitry for fast cycle time, but this may not be required for other applications.

Thus, the more general function indicated by FIG. 1 is illustrated in more detail in FIGS. 5 and 6. The timing described provides both fast array access and cycle times for servicing of many ports within one cycle. This timing and busing scheme requires no significant increase in array, decoder or busing area than a conventional high speed, single-port RAM. Indigenous to the disclosed multi-cycling scheme is automatic port priority enforcement, eliminating the extensive circuitry required to handle contention in conventional multi-port or multi-copy memories used to support parallel processors.

Many alternatives to the particular embodiment described by FIGS. 5 and 6 are possible. An important alternative is shown in the architecture described by FIG. 7. This embodiment is similar to that previously described except that the sequencing of the ports is programmed by the "SQ" input 85. The initial clock input and the subsequent "release-next" signals (derived from the arrays in the same way as in FIGS. 5 and 6) are steered by the SQ address logic 86 to trigger the drive of the port address onto the address bus in the order specified by the SQ bits. The SQ bits are driven also to the data-in SQ logic 87 and the data-out SQ logic 88 for appropriate ordering of these input and output states. The first cycle for all three systems is triggered by the clock signal distributed to the SQ blocks for each system. In the FIG. 7 case, the same as in the FIG. 5 fixed-sequencing example, the release-next timing for the data-in system is the buffered release signal from the address system. The data out system is also the same as in the fixed-sequencing case in that the transition of the data-out bus triggers the state-switching of the previously set up data-out latch. What is different in the FIG. 7 data-out system is that the set-up-next signal is determined by the SQ logic 88, which is triggered to send the next set-up signal by the cycling of the data-out bus. This same distribution of set-up-next signal could be used in the address and data-in latch systems, with a common release signal, as shown for the fixed-sequence case of FIG. 5. Another mix between the fixed sequence case of FIG. 5 and the FIG. 7 programmable-sequencing case would be to have the first or more ports hardwired, with the remaining ports ordered by SQ logic. With a hardwired first port, the first access could be directly triggered by the clock input, as in FIG. 5, with dedicated drivers for the buses, for the fastest first access time (i.e., minimal pipe latency). Also, note that the SQ logic can be simple multiplexing or can be a more complex function. For example, the ordering of the ports could be determined by previous or incoming address or by write-enable or other input states, or even by previously read data.

Many alternatives to the described embodiments will be evident to one skilled in the art. For example, any standard storage means could be used for the array in the VMPRAM, although the means in the preferred embodiment is a six-device CMOS cell. The six-device CMOS sub-array cell is preferred for a fast write-time. The internal node only need be discharged through the small access device until the internal cell latch switches state. The latch then will quickly settle to power supply levels for the stored high and low voltages. In a four-device cell, a poly-load cell, or a DRAM cell, there is no active pull-up device in the cell, and the internal high voltage is charged through the access device in a source-follower mode, which is much slower. Additionally, the CMOS cell has a relatively low alpha-induced soft-error rate (SER) because of the larger stored voltage, the active pull-up current, and the retarded efficiency of charge collection from the substrate. In the cache function for which VMPRAM can be very useful, a very low SER is usually required. Nevertheless, a VMPRAM can be built with these slower cells.

As another example of alternatives to the described embodiment, an additional level of on chip data-out latching can be used to maximize the number of read/write ports. At the cost of one machine cycle latency, the on-chip data-out latching can be used to push the inter-chip transmission into the next cycle. In other words, the first level of latching would collect the data read during the current cycle, which would then be released to the second level of latching and driven off-chip at the next machine clock edge. In this case, the on-chip read access time would be reduced by the data-out drive time. In the terms of equation (1) above, data-out latching could both make D equal to zero and also decrease L, thereby allowing an increase in N. Thus, on-chip data-latching could be useful for the same reasons as in a conventional design, but could have additional leverage in VMPRAM for providing a larger number of read/write ports.

These data-out latches along with additional decoding also can be used to provide a late-select for cache operations. The late-select addresses can be clocked-in with the next chip-select and the release of the data-out drive then made conditional on their decode. Another choice would be to have the late select address ports be asynchronous with mid-machine-cycle arrival of bits, so that the data-out port states at the end of a machine cycle correspond to the addresses received during that cycle. In this case the late-select decode circuity is placed before the latches for the data-out pin drivers.

The VMPRAM preferred embodiment assumes an I/O package capability large enough to have dedicated pins for all I/O bits. If the same package is used for both the CPU chips and the VMPRAM chips, the large I/O required for the CPU would also be available to the VMPRAM. If need be, however, many alternatives for reducing the pin count is possible for the VMPRAM. For example, with the addition of a timing signal (a "hand-shake" signal) for time-division-multiplexing (TDM) of some of the ports, the pin count could be reduced to close to that for a single-port RAM. To what extent this is possible depends on the speed potential of the inter-chip net design. If the inter-chip cycle can be as fast as on the on-chip cycle, then the VMPRAM with a serial port degenerates to the single-port case. Usually, this is not the case, but the inter-chip frequency often can be twice the CPU cycle rate, allowing a halving of the VMPRAM port pin count.

As another example, the VMPRAM on-chip latching would allow the data-in and data-out to share the same pins, if the timing could be coordinated with the system requirements for a data-out window. With the circuitry described for the preferred embodiment, the data-in hold time requirement is small enough to allow some data-out states to appear on those same pins for some portion of the machine cycle time. Of course, I/0 pin sharing also may require switchable termination or some other accommodation appropriate to the particulars of the interface design.

Pipelining for DRAM cells, or any other cell which requires a restore or a longer write time, has been shown for the single-port case. These techniques could be used with the same VMPRAM architecture and timing approach described for the preferred six-device CMOS cell case. Circuitry would need to be added to perform a compare between sequential addresses to assure that the same sub-array is not accessed until enough time has lapsed for the restore. When the compare indicates a conflict, a wait-state signal needs to be sent to the system, the same as in the single-port case. Alternatively, an on-chip cross-point switch could be added to dynamically order the port sequencing based on a compare of the addresses to try to avoid accessing the same sub-array too often. With this added function, the frequency of encountering a wait state could be cut by the number of address ports. Relative to the six-device CMOS cell, the added complexity for accommodating the slower DRAM cells may be worthwhile where the much higher cell density is important and the SER increase can be tolerated.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. In an array of single port static random access memory (RAM) cells, a method of performing multiple read and write accesses during a single machine cycle of a machine to which said array is coupled, said machine cycle being a basic timing cycle of said machine, said method comprising the steps of:

temporarily storing a plurality of addresses and data input words;

selecting one or more RAM cells in said array according to one of said plurality of addresses;

reading data from or writing data to selected RAM cells according to a read or write input to said array;

detecting that a RAM cell has been read or written;

generating a release next cycle signal upon the detection that a RAM cell has been read or written; and repeating said steps of selecting, reading or writing, detecting and generating until all temporarily stored addresses have been used to access said array during a machine cycle, wherein a multiple cycling of said array of RAM cells is performed during said machine cycle, a timing for said multiple cycling being derived from self-timed signals generated within said array.

2. The method recited in claim 1 further including the steps of:

driving data read from selected RAM cells onto a data-out bus, wherein said array includes bitlines and lines internal to said array; and precharging said bitlines and said lines internal to said array upon a RAM cell having been read or written.

3. The method recited in claim 2 further including the steps of:

generating a set-up next cycle signal after each repetition of said reading or writing step; and detecting said set-up next cycle signal for initiating a succeeding repetition of said selecting step.

4. The method recited in claim 1 further including the step of driving data read from selected RAM cells onto a data-out bus.

5. The method recited in claim 4 wherein said array includes bitlines and lines internal to said array, said method further including the step of precharging said bitlines and said lines internal to said array upon a RAM cell having been read or written.

6. The method recited in claim 5 further including the step of generating a set-up next cycle signal after each repetition of said reading or writing step.

7. The method recited in claim 6 further including the step of detecting said set-up next cycle signal for initiating a succeeding repetition of said selecting step.

8. The method recited in claim 1 wherein timing of performing said multiple accesses is derived from said cycling of said array of RAM cells.

9. The method recited in claim 8, wherein said array includes bitlines and lines internal to said array, said method further including the step of precharging said bitlines and said lines internal to said array upon a RAM cell having been read or written, wherein timing of generating a release next signal is derived from a signal for initiating a precharging of said bit lines and said lines internal to said array.

* * * * *